（12）United States Patent
Bauer et al.

(10) Patent No.: US 8,948,225 B2
(45) Date of Patent: Feb. 3, 2015

(54) INTERBAND CASCADE LASER AMPLIFIER MEDIUM

(71) Applicant: Julius-Maximilians-Universitaet Wuerzburg, Wuerzburg (DE)

(72) Inventors: Adam Bauer, Donaustauf (DE); Sven Hoefling, Zellingen (DE); Lukas Worschech, Wuerzburg (DE); Martin Kamp, Gerbrunn (DE)

(73) Assignee: nanoplus Nanosystems and Technologies GmbH, Gerbrunn (DE)

( * ) Notice: Subject to any disclaimer, the term of this patent is extended or adjusted under 35 U.S.C. 154(b) by 45 days.

(21) Appl. No.: 13/664,634

(22) Filed: Oct. 31, 2012

(65) Prior Publication Data

US 2013/0121361 A1 May 16, 2013

(30) Foreign Application Priority Data

Oct. 31, 2011 (DE) .......................... 10 2011 117 278

(51) Int. Cl.
*H01S 5/00* (2006.01)
*H01S 5/34* (2006.01)

(52) U.S. Cl.
CPC ............. *H01S 5/3422* (2013.01); *H01S 5/3416* (2013.01); *H01S 5/3401* (2013.01)
USPC .................................... 372/44.01; 372/46.01

(58) Field of Classification Search
CPC .... H01S 5/3401; H01S 5/3416; H01S 5/3422
USPC ........................................... 372/44.01, 46.01
See application file for complete search history.

(56) References Cited

U.S. PATENT DOCUMENTS

| 2005/0041711 | A1 | 2/2005 | Belenky et al. |
| 2008/0273565 | A1* | 11/2008 | Gmachl et al. ............ 372/45.012 |
| 2010/0097690 | A1* | 4/2010 | Vurgaftman et al. ......... 359/344 |
| 2011/0007768 | A1* | 1/2011 | Yamanishi et al. ........ 372/45.01 |

OTHER PUBLICATIONS

Y.M. Mu et al., "Phonon-assisted Carrier Transport in Type-II Interband Quantum Cascade Lasers", Physics and Simulation of Optoelectronic Devices X, Proceedings of SPIE vol. 4646, 2002, pp. 51-59.

* cited by examiner

*Primary Examiner* — Yuanda Zhang
*Assistant Examiner* — Michael Carter
(74) *Attorney, Agent, or Firm* — Mendelsohn, Drucker & Dunleavy, P.C.; Steve Mendelsohn

(57) ABSTRACT

An interband cascade laser amplifier medium (M) having a number of cascades (C) strung together along a transport direction (T) of charge carriers and each having an electron injector region (I), an amplifier region (V) and an electron collector region (K), wherein the amplifier region (V) has a hole quantum film (1) having a first semiconductor material and an electron quantum film (2) having a second semiconductor material, and wherein the electron collector region (K) has at least one collector quantum film (4) having a third semiconductor material and separated by a first barrier layer (3), and the electron injector region (I) has at least one injector quantum film (5) having a fourth semiconductor material and separated by a second barrier layer (3).

19 Claims, 2 Drawing Sheets

INTERBAND CASCADE LASER AMPLIFIER MEDIUM

FIELD

At least one embodiment of the invention relates to an interband cascade laser amplifier medium having a number of cascades strung together along a transport direction of charge carriers and each comprising an electron injector region, an amplifier region and an electron collector region, wherein the amplifier region comprises a hole quantum film comprising a first semiconductor material and an electron quantum film comprising a second semiconductor material, and wherein the electron collector region comprises at least one collector quantum film comprising a third semiconductor material and separated by a first barrier layer, and the electron injector region comprises at least one injector quantum film comprising a fourth semiconductor material and separated by a second barrier layer.

BACKGROUND

Such an interband cascade laser amplifier medium is known, for example, from U.S. Pat. No. 5,799,026 or from US 2010/0097690 A1. In this case, the optical transition used for the laser activity takes place between the hole quantum film and the electron quantum film. In this case, quantum film means that on account of the thickness of the corresponding semiconductor layers and as a result of the localization of the electrons in the conduction band of the electron quantum film and of the holes in the hole quantum film on account of the band profile with respect to adjacent layers, there is a quantization of the population levels perpendicular to the layer plane. Through suitable choice of the semiconductor materials, in particular the valence band edge of the hole quantum film is energetically above the conduction band edge of the electron quantum film. For this case, the emission wavelength in the case of an optical transition of an electron from the conduction band of the electron quantum film into the valence band of the hole quantum film becomes practically independent of the respective band gaps of the semiconductor materials involved. This allows, for example, semiconductor laser emissions in a wavelength range of between 3 μm and 5 μm, which, in the case of a dependence of the optical transition on the band gap of the semiconductor materials, has not been possible in an uninterrupted fashion heretofore in continuous wave operation at room temperature. Laser emissions in the so-called medium infrared range (MWIR) between 2.5 μm and 8 μm are of interest particularly for chemical analyses, for target seeking devices or for applications in the medical field. The optical transition of the electron takes place between the conduction band of the electron quantum film and the valence band of the hole quantum film, that is to say between spatially adjacent semiconductor materials. A locally indirect band transition is involved. In the present case, this is referred to as a so-called type II semiconductor laser in this context. By contrast, if the optical transition takes place locally directly between the conduction band and the valence band of the same semiconductor material, then this is referred to as a type I semiconductor laser.

InAs, InAsSb, InGaAs or InAlAs are known as semiconductor materials for the electron quantum film from U.S. Pat. No. 5,799,026. GaSb, GaInSb, GaSbAs and GaAlSb are disclosed as semiconductor materials for the adjacent hole quantum film in U.S. Pat. No. 5,799,026. The position of the conduction band edges and of the valence band edges of the electron and hole quantum films is configured for optimizing the optical transition through the choice of the III-V compound semiconductors and the thickness of the quantum films.

In contrast to a semiconductor diode laser, such as is described in U.S. Pat. No. 5,793,787, for example, a unipolar transport of a single charge carrier type, that is to say either of electrons or of holes, along the laser material takes place in the case of an interband cascade laser. For this purpose, an external voltage is applied to the laser material, such that charge carriers of one type migrate into the laser material on one side and leave the laser material again on the other side. Accordingly, the entire semiconductor material of a laser of this type has a uniform charge carrier doping. An n-type doping is provided for the transport of electrons as uniform majority charge carriers; a p-type doping for the transport of holes as uniform majority charge carriers.

A different concept in turn is pursued by a so-called quantum cascade laser such as is described in U.S. Pat. No. 6,137,817, for example. In that case, too, a unipolar transport of charge carriers, in particular of electrons, along the laser material takes place. The laser material of the quantum cascade laser comprises strung-together amplifier regions and injector regions which are formed by electron quantum films separated from one another by means of barrier layers. Both the optical transition and the transport of the electrons to the next amplifier region take place exclusively in the conduction band of the laser material.

In order to be able to use an electron that has relaxed in the amplifier region of an interband cascade laser as a result of optical transition into the valence band of the hole quantum film for the purposes of a cascade multiply for further optical transitions, in an interband cascade laser amplifier medium the amplifier region is adjoined by an electron collector region and an electron injector region. The electron collector region comprises at least one collector quantum film separated by means of an electron barrier layer. The electron injector region comprises an injector quantum film separated by means of an electron barrier layer. The valence band edge of the collector quantum film, that is to say of the third semiconductor material, is energetically adapted for taking up an electron from the valence band of the hole quantum film, that is to say of the first material. The conduction band edge of the injector quantum film, that is to say of the fourth semiconductor material, is energetically adapted for taking up an electron from the valence band of the third semiconductor material.

According to U.S. Pat. No. 5,799,026 or US 2010/0097690 A1, a plurality of collector and injector quantum films and barrier layers can alternate both in the electron collector region and in the electron injector region. The barrier layer used between the amplifier region and the electron collector region prevents undesirable tunneling of the electron from the electronic level of the electron quantum films without the electron having relaxed radiatively into the energetically lower energy level in the hole quantum film.

In accordance with the prior art cited, the collector quantum films are configured with regard to their thickness and the choice of semiconductor material such that, for example, the highest quantized hole level therein corresponds energetically approximately to the highest quantized hole level in the valence band of the hole quantum film. In particular, in the operating case the approximately linear profile of the electric field resulting from the applied external voltage within the semiconductor material should be taken into consideration in this case. The electron is thus allowed in particular to tunnel resonantly from the valence band of the hole quantum film into the valence band of a collector quantum film."

In order to have the electron available again for an optical transition in a further cascade, the electron collector region of one cascade is adjoined by the electron injector region of the next cascade. The task of the electron injector region is to transfer the electron from the valence band of the collector quantum film into an electronic level in the conduction band of the injector quantum film, such that it can relax from there via the conduction band of an adjoining electron quantum film radiatively again into the valence band of a hole quantum film.

For this purpose, the conduction band of the adjoining injector quantum films is configured through the choice of the thickness and of the semiconductor material such that, by way of example, the lowest quantized level therein, taking the field profile into consideration, is energetically approximately identical to the highest quantized hole level in the valence band of the last collector quantum film.

GaSb, GaInSb or GaSbAs, inter alia, are known as semiconductor materials for the collector quantum film from U.S. Pat. No. 5,799,026. The materials of the electron quantum film are used as materials for the injector quantum film. On account of the field profile resulting from the external voltage in the operating case within the semiconductor material, which leads to band tilting, an electron when passing through the semiconductor material can thus be used multiply for the same optical transition at different locations. For this purpose, a plurality of cascade are connected in series by means of a corresponding layer construction. The electron collector region of one cascade takes up the electron that has undergone transition and passes it on to the electron injector region of the next cascade. The latter injects the electrons again into an amplifier region, where they relax as a result of optical transition. Overall, in this way an electron rapidly passing through the laser medium is utilized multiply for an optical transition.

The barrier layers enabling the electrons to tunnel by providing the potential barriers are constructed, in accordance with U.S. Pat. No. 5,799,026, in particular from semiconductor materials such as AlSb, AlInSb, AlSbAs or AlGaSb. These materials have a relatively large band gap. The levels—relevant to the optical transition—of the electrons and holes in the conduction band and in the valence band of the adjacent layers are energetically within the band gap of the barrier layers.

In the case of a diode laser, by contrast, the optical transition is situated within the depletion zone of a p-n junction. Charge transport predominantly takes place by means of electrons in the n-doped region, and by means of holes in the p-doped region. For laser operation, the radiative recombination of electrons and holes in the depletion zone is crucial, which are injected from opposite directions (contacts). In other words, bipolar charge transport by means of electrons and holes takes place. Electrons that have relaxed radiatively in the amplifier region are not transported further. Consequently, each injected electron in the case of a diode laser can contribute maximally to the emission of one photon in the device.

For the electrical connection of the laser material of an interband cascade laser, specific connection and termination layers are furthermore known from the prior art. However, the exact construction of these layers is not the subject matter of the present invention.

The forwarding of the electrons after their optical transition from the valence band of the hole quantum film into the electron collector region, and from there into the adjoining electron injector region, which passes the charge carriers once again into the electron quantum film of the next amplifier region, takes place by means of tunneling processes through the barrier layers. These tunneling processes proceed, with a time constant of down to 0.1 ps, very much faster than the transition from the optically active electronic level of the electron quantum film to the hole level of the hole quantum film, which has a relaxation time of approximately 1 ns. As a result, at first glance, the population inversion as a basic prerequisite for laser operation is fulfilled.

Previous considerations regarding the design of the laser material of an interband cascade laser are therefore based on enabling the electrons, or in the complementary picture the holes, to be transported further through the laser medium by resonant tunneling. Taking account of the band tilting as a result of the voltage applied to the laser material in the operating case, the barrier layers, the collector quantum films and the injector quantum films are therefore designed with regard to thickness and semiconductor material such that the subbands of a cascade that are formed by quantization perpendicular to the layer plane are energetically substantially at the same level. This allows the charge carriers to tunnel along the cascade resonantly and thus rapidly. In this case, the charge carriers are transported perpendicular to the layer planes. The charge carriers tunnel since the individual subbands spatially overlap along the transport direction, thus affording a certain probability of transition between the individual subbands.

It is disadvantageous that the charge carriers have no preferred direction whatsoever in the case of a resonant tunneling process. The resonant tunneling process can equally also proceed counter to the transport direction provided and thus refill for example states at the lower laser level, that is to say in the valence band of the hole quantum film, which are then no longer available for generating photons in the next cascade. This is problematic particularly during operation at or above room temperature, since the charge carriers thus gain thermal energy (approximately 26 meV at 300 K) and purported potential barriers that are intended to prevent thermal backfilling can thus also be surmounted increasingly more easily.

SUMMARY

Therefore, it is an object of at least one embodiment of the invention to specify an interband cascade laser amplifier medium of the type mentioned in the introduction in which the undesirable effect of backfilling of the charge carriers counter to the transport direction is reduced with respect to an interband cascade laser amplifier medium in accordance with the prior art.

For an interband cascade laser amplifier medium of the type mentioned in the introduction, this object is achieved according to at least one embodiment of the invention by virtue of the fact that along the cascade and/or between two adjacent cascades in a conduction band and/or in a valence band at least two subbands transport-coupled for charge carriers are formed in such a way that the succeeding subband in the transport direction, relative to the preceding subband in the transport direction, in the electric field of the operating case, is reduced energetically by an absolute value substantially equal to the energy of an optical phonon of the semiconductor materials involved.

In this case, at least one embodiment of the invention proceeds in a first step from the consideration of predefining a preferred direction, namely the desired transport direction, for the movement of the charge carriers in the conduction and valence bands of the laser material of an interband cascade laser. In other words, a movement of the charge carriers in the transport direction is intended to take place with preference relative to a movement of the charge carriers counter to the transport direction. During a resonant tunneling process of the charge carriers between two transport-coupled subbands whose wave functions overlap and which substantially do not differ energetically, no preferred direction is provided for the transport of the charge carriers. During a resonant tunneling process, the charge carriers can move equally in the transport direction as well as counter to the transport direction. Charge carriers moving counter to the transport direction are in this respect no longer directly available for a further optical transition.

In a second step, at least one embodiment of the invention proceeds from the insight that a discrimination of the movement of the charge carriers counter to the transport direction can be obtained by virtue of the succeeding transport-coupled subband in the transport direction being reduced energetically by the design of the layers and quantum films involved. In this case, for their movement counter to the transport direction, charge carriers have to take up thermal energy in order to reach the energetically higher subband. Backfilling of subbands counter to the transport direction is thus discriminated relative to a movement of the charge carriers in the transport direction.

In a third step, finally, at least one embodiment of the invention proceeds from the further consideration that the optical transition in the amplifier region between electron quantum film and hole quantum film must not be impaired by the provision of reverse potential barriers between the transport-coupled subbands. In particular, the population inversion between the upper laser level in the conduction band of the electron quantum film and the lower laser level in the valence band of the hole quantum film must not be destroyed. This is accomplished, however, by virtue of the fact that the succeeding subband in the transport direction, relative to the preceding subband in the transport direction, taking account of the electric field of the operating case, is reduced energetically by an absolute value substantially equal to the energy of an optical phonon of the semiconductor materials involved.

In this case, at least one embodiment of the invention takes account of the circumstance that a time constant of approximately 1 ps is provided for an optically phonon-assisted transition between the two subbands in the considered laser material comprising III-V semiconductor materials. Time constants of less than 1 ps can also be achieved for longitudinal optical phonons. Accordingly, it is much shorter than the already mentioned time constant during the optical transition between the conduction band of the electron quantum film and the valence band of the hole quantum film, which is approximately 1 ns. The tunneling process in the considered laser material, with time constants of down to 0.1 ps, therefore proceeds very much faster than the optical transition and faster than or with speed comparable to the transition between the transport-coupled subbands with participation of an optical phonon. If the tunneling process of the charge carriers is in this respect combined and/or superimposed with an optical phonon transition, then the population inversion in the amplifier region of the laser material is not destroyed. Preferably, therefore, the absolute value of the at least two transport-coupled subbands is reduced in the manner substantially equal to the energy of a longitudinal optical phonon of the semiconductor materials involved.

The energy for generating optical phonons, i.e. optical lattice vibrations in the III-V semiconductor materials involved, is approximately in the range of between about 24 meV to above 40 meV. Values from this range extend beyond the absolute value of thermal energy that can be gained by the charge carriers involved at room temperature, which is approximately 26 meV at 300 K. In this respect, by providing potential differences in the transport direction which correspond to the energy of an optical phonon, at least one embodiment of the invention not only provides a preferred transport direction of the charge carriers involved, without the population inversion being destroyed, but it also enables backfilling of energetic levels to be efficiency suppressed even when the interband cascade laser is operated at room temperature or above the latter. The energy for generating transverse or longitudinal optical phonons is in this case substantially comparable. By way of example, reference should be made in this respect to P. H. Borcherds and K. Kunc, "The lattice dynamics of indium pnictides", J. Phys. C., Solid State Phys., vol. 11, 1978.

Preferably, the energetic separation of the transport-coupled subbands in the semiconductor layers involved is chosen with a value adapted in a layer-dependent manner substantially in accordance with the energy of an optical phonon, in particular of a longitudinal phonon, in the respective semiconductor layer.

In this case, transport-coupled subbands are understood to mean such electronic levels in the conduction band or the valence band which are quantized by the layer construction of the laser material and whose descriptive wave functions have a spatial overlap along the transport direction, such that for charge carriers there is non-vanishing probability of a transition between two subbands, in particular tunneling is made possible. If the energetic differences between the subbands are chosen in the region of the energy of an optical phonon, then tunneling in the quantum mechanical sense strictly speaking does not take place, since a lattice quantum is generated. However, the charge carrier tunnels in the sense that it passes through barrier layers which it cannot overcome in the classical sense.

At least one embodiment of the present invention is described primarily using the electron picture, according to which the laser materials of the interband cascade laser are n-doped, such that electrons as majority charge carriers move along the transport direction from cascade to cascade. However, at least one embodiment of the invention can also be described without restriction using the hole picture, wherein the involved semiconductor materials of the interband cascade laser are p-doped, such that holes as majority charge carriers move in the opposite transport direction from cascade to cascade. Those skilled in the art occasionally abandon this strict separation, and in particular they designate the electron collector region in the hole picture as a hole injector region in a practical manner, even if electrons as uniform charge carriers move through the laser material.

Preferably, the preceding subband in the transport direction of the two subbands that differ energetically by an absolute value substantially equal to the energy of an optical phonon is formed in the valence band of the electron collector region and the succeeding subband in the transport direction is formed in the conduction band of the electron injector region. In other words, the electron as charge carrier, upon its transition from the valence band of the electron collector region to the conduction band of the electron injector region, loses an energy amounting to the energy of an, in particular longitudinal, optical phonon; in other words, upon transition between the subbands an optical phonon is excited in the semiconductor material. If the energy gap is typically in the range above the thermal energy, which is 26 meV at room temperature, the undesired loss path of electrons counter to the transport direction is prevented.

In another preferred configuration, the preceding subband in the transport direction of the two subbands that differ energetically by an absolute value substantially equal to the energy of an optical phonon is formed in the conduction band of the electron injector region and the succeeding subband in the transport direction is formed in the conduction band of the electron quantum film. In other words, this is a phonon-assisted transition from the electron injector region to the upper laser level in the conduction band of the electron quantum film. For this purpose, by way of example, a plurality of injector quantum films with barrier layers formed therebetween can be configured in such a way that the overlapping subbands allow resonant tunneling of the charge carriers in the electron injector region. The energetic position of the miniband—which results in this case in the electron injector region—of a number of overlapping subbands then has an energetic separation in the range of an optical phonon with respect to the upper laser level in the conduction band of the electron quantum film. The filling of the upper laser level therefore takes place, as described above, with a fast time constant with the predefinition of a preferred direction in the laser material.

In a further expedient configuration, the preceding subband in the transport direction of the two subbands that differ energetically by an absolute value substantially equal to the energy of an optical phonon is formed in the valence band of the hole quantum film and the succeeding subband in the transport direction is formed in the valence band of the electron collector region. In other words, a phonon-assisted transition from the lower laser level to the valence band of the electron collector region takes place.

The transition between the conduction band of the electron injector region and the conduction band of the electron quantum film and/or from the valence band of the hole quantum film to the valence band of the electron collector region can if necessary also be made fast by resonant tunneling, wherein the subbands that differ in terms of the energy of an optical phonon are formed as follows within the amplifier medium.

Advantageously, the at least two subbands that differ energetically by an absolute value substantially equal to the energy of an optical phonon are formed in the valence band of the electron collector region. With this configuration, the further transport of the charge carriers within the electron collector region is phonon-assisted. Reverse tunneling to the lower laser level of the valence band of the hole quantum film is thereby suppressed.

In particular, in a further expedient configuration, it is possible to combine the phonon-assisted transition between transport-coupled subbands in the valence band of the electron collector region with the above-described phonon-asserted transition of an electron from the valence band of the electron collector region to the conduction band of the electron injector region. In this case, two or more phonon transitions are possible during the tunneling of the charge carriers from the electron collector region to the electron injector region of the next cascade. In addition to the fast progression of these processes in the ps range, the energy gap between the individual levels is once again above the thermal energy at room temperature, which results in the discrimination of a movement of the charge carriers counter to the transport direction.

In particular, the number of transport-coupled subbands which have an energetic separation in the range of a phonon transition with respect to one another is not fixed at two. Rather, in one advantageous configuration, the electron collector region comprises a multiplicity of collector quantum films separated by barrier layers, wherein in the valence band of the electron region along the transport direction a subband cascade is formed from subbands that differ energetically in each case by an absolute value substantially equal to the energy of an optical phonon.

If the transition of the charge carriers from the valence band of the electron collector region to the conduction band of the electron injector region and also the filling of the upper laser level from the conduction band of the electron injector region in each case take place in a phonon-assisted manner, then the subbands within the electron injector region can be regarded as a charge carrier reservoir from which electrons are extracted for filling the upper laser level in the conduction band of the electron quantum film. Said charge carrier reservoir is then equally filled as well as emptied by means of phonon-assisted transitions. On both sides of this charge carrier reservoir in the electron injector region, the energy gaps between the levels involved in the range of the energy of an optical phonon prevent thermal backfilling even at high operating temperatures. The transition from the conduction band of the electron injector region to the conduction band of the electron quantum film can in turn alternatively also be embodied by resonant tunneling.

According to current prior art, the layer sequences that constitute the electron injector region and comprise injector quantum films and barrier layers are chosen in such a way that in the electric field of the operating case the respective energy levels are approximately energetically at one magnitude and a miniband is thus fashioned. The possible energy states of this miniband are given by the overlapping quantized states of the individual injector quantum films. According to the laws of quantum mechanics, a barrier-free movement of the charge carriers is possible within said miniband. Scattering losses are then minimized, but the abovementioned problem of thermal activation at high temperatures is present.

However, if the electron injector region is designed in such a way that, in the case of the electric field prevailing during laser operation, the energetic separation of at least two transport-coupled subbands is in each case in the range of the energy of an optical phonon, the problem of thermal backfilling is solved. In a further preferred configuration, therefore, the at least two subbands that differ energetically by an absolute value substantially equal to the energy of an optical phonon are formed in the conduction band of the electron injector region.

Furthermore, if the electron injector region is constructed by a multiplicity of injector quantum films separated by barrier layers, then a cascading of the phonon-assisted transitions is advantageously realized in the conduction band of the electron injector region. If, in the conduction band of the electron injector region along the transport direction, a subband cascade is formed from subbands that differ energetically in each case by an absolute value substantially equal to the energy of an optical phonon, then the total energy level that charge carriers would have to overcome in order to be able to pass through the laser material backward counter to the transport direction is a multiple of the thermal energy at room temperature. From this standpoint, thermal backfilling of levels counter to the transport direction can be virtually completely eliminated.

Moreover, the abovementioned embodiment variants can also be combined arbitrarily. Thus, it is possible to form cascades made from phonon-assisted transitions between transport-coupled subbands in the valence band of the electron collector region and/or in the conduction band of the electron collector region and likewise individual transitions within the conduction band or the valence band or between the amplifier region, the electron collector region and the electron injector region or between the electron injector region and the amplifier region. Moreover, at a suitable location it is possible to fashion transitions between transport-coupled subbands by means of resonant tunneling.

In a further preferred configuration of the interband cascade laser amplifier medium, at least two electron quantum films are provided. Advantageously, a so-called W quantum film is formed, in particular, in which the hole quantum film is embedded between two electron quantum films. In this case, the thickness of the two electron quantum films can also vary relative to one another. In particular, reference is thereby made to the adjacent electron collector region.

The first semiconductor material of the hole quantum film, on account of the band structure, is preferably a compound semiconductor selected from the group containing GaSb, GaInSb, GaSbAs, GaAlSb, AlGaInSb and AlGaAsSb. In an alternative thereto, the first semiconductor material is an at least quaternary GaInSbAs compound semiconductor comprising, if appropriate, further admixtures of Al, P and/or N. In the system—currently favored for emission wavelengths of more than 2 μm—for a W quantum film comprising electron quantum films comprising InAs, such a compound semiconductor, through the addition of arsenic, affords the possibility of reducing lattice strains by comparison with the substrate comprising GaSb usually used, in conjunction with an increased indium content. By increasing the indium content, it is possible to increase the spatial overlap between the residence probabilities of electrons and hole wave function particularly in a type II W quantum film of an interband cascade laser amplifier medium and thus the transition probability of the optical transition in the amplifier region. By means of admixtures of Al, P and/or N, it is possible to perform a further adaptation with regard to the transition probabilities, the emission wavelengths or the lattice constant of the crystal structure. With this system of III-V semiconductors, variation is obtained in the range of the lowest possible band gap energies.

The first semiconductor material of the hole quantum film is particularly preferably a quaternary $Ga_xIn_{1-x}Sb_yAs_{1-y}$ compound semiconductor. In this notation, the indices x and y are normalized to the value 1 and correspond in this respect, multiplied by a factor of 100, to the percentage proportion of the respective element within the elements of main group III (here Ga, In) and main group V (here As, Sb) of the periodic system. Just a small amount of arsenic suffices to reduce the degree of strain, such that the indium proportion can be increased further. In addition, $Ga_xIn_{1-x}Sb_yAs_{1-y}$ has a band gap that decreases as the arsenic proportion increases. For a constant emission wavelength, the electron quantum films can be chosen to be thinner as a result, which significantly increases the spatial overlap of the residence probabilities of the electrons in the conduction band of the electron quantum film and of the hole wave function in the valence band of the hole quantum film.

Preferably, the index x has a value of greater than 0 and less than 0.7. This corresponds to an indium content of greater than or equal to 30% relative to gallium. Increasing the indium content to above 30% increases the spatial overlap of the residence probabilities of the electrons and holes in the amplifier region, wherein the increasing undesirable lattice strain can be reduced by a proportion of arsenic. In this case, high arsenic proportions correlate with high indium proportions. At low indium proportions, smaller amounts of arsenic are sufficient.

With further preference, the lower limit value of the index x is equal to 0.2, which corresponds to an indium proportion of less than or equal to 80%. Above 80%, an adaptation of the tunneling level of the adjacent electron collector region becomes more difficult, since the band gap between valence and conduction band is increasingly reduced by the addition of indium in the quaternary compound semiconductor. Advantageously, the upper limit value of the index x is equal to 0.6 which corresponds to an indium content greater than or equal to 40%. As a result of the simultaneous presence of arsenic, the higher proportion of indium can be utilized for further increasing the efficiency of the optical transition, which has not been possible hitherto on account of the relaxation effects occurring in the lattice structure.

The index y preferably has a value of between 0.5 and 0.99, according to which the arsenic proportion is between 1% and 50%. This range has proved to be advantageous with regard to the band adaptation for a W quantum film. With an arsenic proportion of less than 40% relative to antimony, the lattice strain can furthermore advantageously be brought within acceptable ranges with regard to the radiative transition, wherein at the same time the band adaptation for the tunneling level for transporting the electrons further into a subsequent electron collector region is ensured. The thickness of the hole quantum film is preferably 2 nm to 10 nm.

For the second semiconductor material of the electron quantum film, in principle it is possible to use compound semiconductors containing one or more elements from the group Al, Ga, In and one or more elements from the group As, Sb in any desired combination. Preference is given to using a compound semiconductor selected from the group InAs, InAsSb, InGaAs and GaInAsSb. Through the choice of these III-V semiconductors, it is possible to correspondingly set the conduction band and valence band edges between hole quantum film and electron quantum film for a desired transition wavelength of more than 3 μm. The use of a further element from main group III or V of the periodic system for reducing the lattice strain makes it possible, in the hole quantum film, to reduce the conduction band edge further than has been possible heretofore without a loss in laser efficiency. For a GaInSbAs hole quantum film, in particular, the use of arsenic additionally has the effect that the band gap in the hole quantum film decreases. In this respect, whilst maintaining the emission wavelength, the thickness of the electron quantum films can be reduced further whilst taking account of the quantization of the population levels, which leads to an additional increase in the spatial overlap of the residence probabilities of electrons and holes.

Preferably, the thickness of the electron quantum film is chosen to be small and between just 0.5 nm and 5 nm, in particular between 1 nm and 3 nm.

Expediently, for the third semiconductor material of the collector quantum film, a compound semiconductor is selected from the group GaSb, GaInSb, GaSbAs, GaInAsSb, AlGaInSb, AlGaAsSb and AlGaInAsSb. In this case, the thickness of the collector quantum film is preferably chosen to be between 1 nm and 7 nm.

For the fourth semiconductor material of the injector quantum film, a compound semiconductor is advantageously selected from the group InAs, InAsSb, InGaAs, InAlAs, AlInAsSb, GaInAsSb. In principle, for the fourth semiconductor material of the electron quantum film, it is possible to use compound semiconductors containing one or more elements from the group Al, Ga, In and one or more elements from the group As, Sb in any desired combination.

As material for the first and the second barrier layer, a compound semiconductor is preferably chosen from the group AlSb, AlInSb, AlSbAs, AlGaSb, AlInAsSb. These compound semiconductors are distinguished by a large band gap and, in particular, by a high conduction band edge, as a result of which the confinement of the charge carriers in the adjacent quantum films is realized. Consequently, the barrier layers provide a suitable potential barrier for the tunneling process required for laser operation. For this purpose, the energy level of the low electron states in the conduction band of the electron quantum films lies in the range of the band gap of the barrier layer. The collector quantum films within the electron collector region make available for the radiatively relaxed electrons in the hole quantum film in particular suitable energy levels in the valence band for said tunneling process and/or for the phonon-assisted transition. For the purpose of band adaptation and compensation of the degree of strain relative to the substrate, nitrogen N or phosphorus P can advantageously also be admixed with the compound semiconductors mentioned.

The thickness of the first barrier layer is advantageously between 0.5 nm and 5 nm, in particular between 2 nm and 4 nm. A thickness of between 0.5 nm and 5 nm, in particular between 1 nm and 3 nm, has proved to be advantageous for the second barrier layer.

Furthermore, an interband cascade laser comprising an interband cascade laser amplifier medium of the type described above is specified according to at least one embodiment of the invention. The interband cascade laser amplifier medium is embedded into further layers comprising transition layers, confinement layers and connection layers of differentiated construction. The construction of these layers or plies is known per se and is not the subject matter of the present invention.

BRIEF DESCRIPTION OF THE DRAWINGS

Exemplary embodiments of the invention will be explained in greater detail with reference to a drawing, in which.

DETAILED DESCRIPTION

Figure 1:
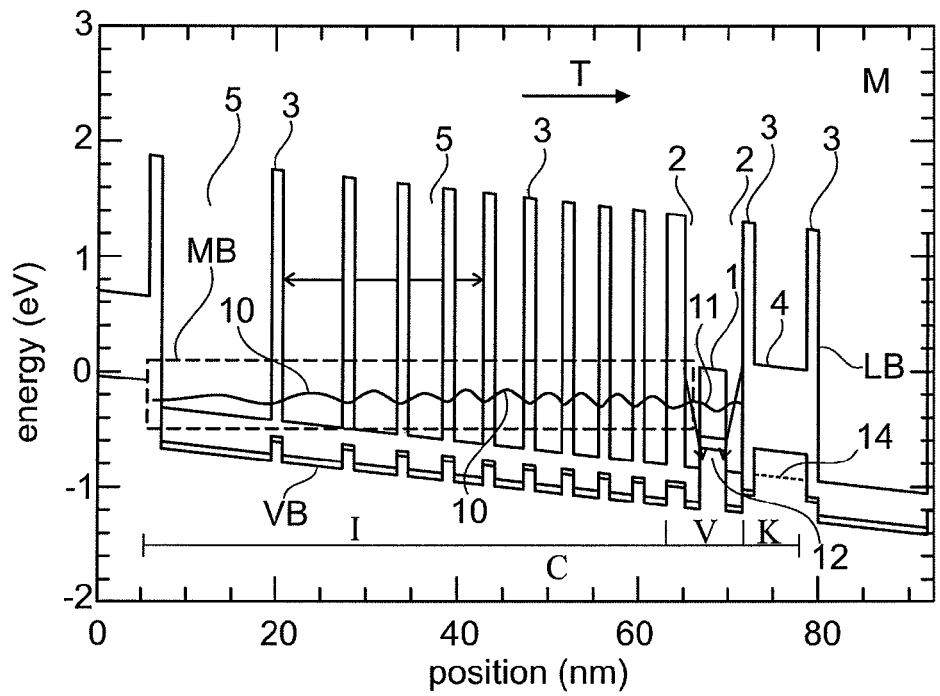
FIG. 1 shows a band diagram of an interband cascade laser amplifier medium according to the prior art.

FIG. 1 shows the band diagram of an interband cascade laser amplifier medium M in accordance with the prior art. The interband cascade laser amplifier medium comprises a plurality of strung-together cascades C each comprising an electron injector region I, an amplifier region V and an electron collector region K. The amplifier region V comprises a hole quantum film 1 embedded between two electron quantum films 2. The amplifier region V is in this respect constructed as a W quantum film amplifier region. The valence band edge of the hole quantum film 1 lies energetically above the conduction band edge of the electron quantum films 2. The amplifier region V comprising the hole quantum film and the two electron quantum films 2 overall is surrounded by two barrier layers 3.

The band profile of the conduction band LB and of the valence band VB of the interband cascade laser amplifier medium M illustrated becomes evident, in principle. The valence band VB is split into a light hole band and a heavy hole band, which is governed on the basis of the crystal.

In the illustration, the amplifier region V is followed toward the right by an electron collector region K, which in the present case comprises a collector quantum film 4 embedded between two barrier layers 3. The electron collector region K is designed for the tunneling of the electrons from the upper hole level in the valence band VB of the hole quantum film 1 to the valence band VB of the collector quantum film 4. An electron injector region I consisting of a number of injector quantum films arranged between barrier layers is furthermore provided for filling the electron quantum film 2. The band tilting on account of the electric field progressing approximately linearly within the laser material during operation can be discerned. The electron collector region K of a cascade C fills the electron injector region I of the next cascade C which follows in the transport direction T.

The hole quantum film 1 typically consists of a GaInSb compound semiconductor. The electron quantum films 2 and the injector quantum films 5 are usually constructed from InAs. The collector quantum film 4 consists of GaSb, for example. The barrier layers 3 are realized by AlSb, for example.

The electron injector region I injects electrons as charge carriers into the upper laser level of the amplifier region V, which in the present case is provided as the electronic ground state level of the electron quantum films 2. The residence probability described is depicted. The ground state level is also designated as subband 11. From the subband 11, the optical transition of the electrons to the lower laser level takes place, said level being provided by the energetically highest subband 12 or energetically lowest hole level 12 in the valence band VB of the hole quantum film 1. The optical transition thus takes place between the conduction band LB of the electron quantum films 2 and the valence band VB of the hole quantum film 1. This is a type II semiconductor laser.

The electron collector region K is designed in such a way that the energetic position 14 of the lower laser level or subband 12 in the hole quantum film 1 approximately corresponds to the upper subband in the valence band VB within the collector quantum film 4. Consequently, after optical transition in the amplifier region V an electron as charge carrier is allowed to tunnel into the valence band VB of the electron collector region K.

The electron injector region I of a cascade C follows the collector region K of the preceding cascade C. The first injector quantum film 5 in this regard is configured in such a way that the energetic position of the quantized ground state there in the conduction band LB approximately corresponds to the energetic position of the highest level in the valence band VB of the electron collector region K. The electron collector region K thus transfers an electron from the valence band VB to the conduction band LB of the electron injector region I.

It is evident from FIG. 1 that the electron injector region I comprises a multiplicity of injector quantum films 5 separated by barrier layers 3. The respective valence band and conduction band edges decrease according to FIG. 1 toward the right in accordance with the linear profile of the electric field when an external voltage is applied. In order to enable the electrons to tunnel in a manner as free of barriers as possible within the electron injector region I in the transport direction T for the purpose of filling the upper laser level in the amplifier region V of the next cascade C, the thickness of the injector quantum films 5 decreases with increasing proximity to the amplifier region V. As a result, the energetic position of the respective ground state level in the conduction band increases, such that the subbands arising within the electron injector region I are energetically at approximately the same magnitude. Overall, in the electron injector region I the overlap of the individual subbands results in a so-called miniband, in which the electrons can move in the manner free of barriers whilst avoiding scattering processes. This leads to rapid filling of the upper laser level in the amplifier region V.

The prior art illustrated in FIG. 1 has the disadvantage, however, that the charge carriers in the miniband of the electron injector region I exhibit no preferred direction. Rather, it is possible for the electrons to move counter to the transport direction T, such that they are no longer available for a renewed optical transition in the amplifier region V of the next cascade C.

Figure 2:
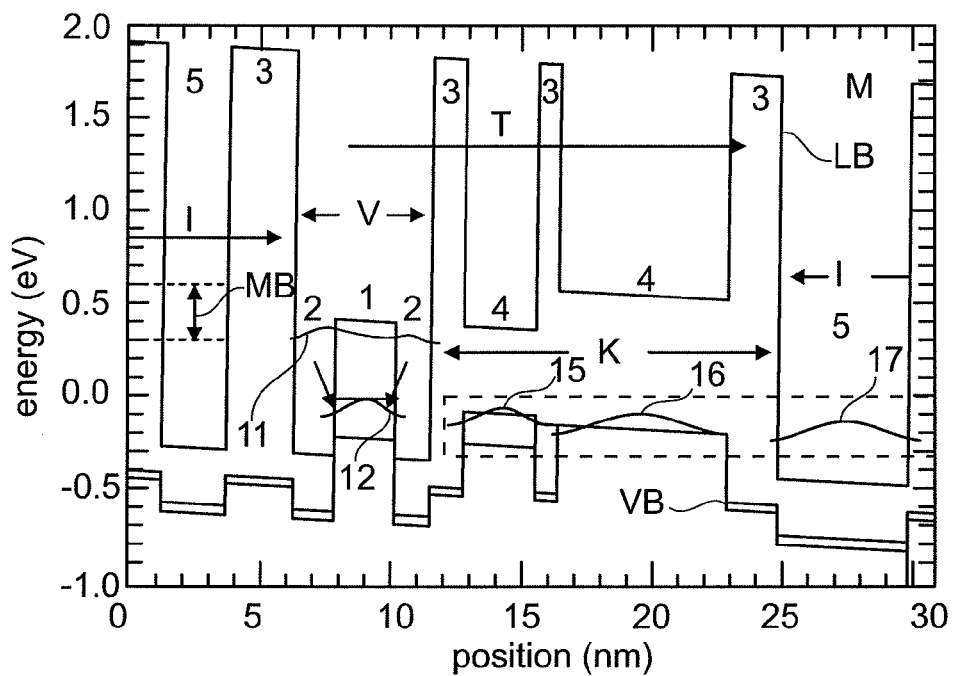
FIG. 2 shows a band diagram of an interband cascade laser amplifier medium with a phonon-assisted transition within the electron collector region and between the electron collector region and the electron injector region.

FIG. 2 then illustrates the band diagram for an interband cascade laser amplifier medium M designed in such a way that undesirable backfilling of levels counter to the transport direction T is avoided as far as possible.

The amplifier region V, the electron collector region K and the electron injector region I are once again evident from FIG. 2. The amplifier region V again comprises a hole quantum film 1 embedded in the sense of a W quantum film between two electron quantum films 2. The ground state level or subband 11 arising as a result of the coupling of the two electron quantum films 2 as upper laser level is represented by the profile of the descriptive residence probability of an electron along the transport direction T. The illustration likewise depicts the hole wave function describing the energetically lowest hole state or the subband 12 at the lower laser level in the valence band VB of the hole quantum film 1. The optical transition takes place between the subband 11 in the conduction band LB of the electron quantum films 2 and the subband 12 in the valence band VB of the hole quantum film 1.

After optical transition, on account of the configuration of the electron collector region K or of the collector quantum films 4 situated therein it is possible for an electron to tunnel into the subband 15 of the adjacent collector quantum film 4. Within the electron collector region K a second collector quantum film 4 follows in an adjacent fashion in the transport direction T, wherein the resulting corresponding subband 16 as energetically lowest hole or energetically highest electron level is again represented by the descriptive residence probability. In the following electron injector region I, the illustration depicts the ground state level or subband in the conduction band LB of the first injector quantum film 5.

In accordance with FIG. 2, the barrier layers 3, the collector quantum films 4 and the first injector quantum film 5 adjacent to the electron collector region K are designed in such a way that the energetic position of the subband 16 is reduced relative to the subband 15 and that of the subband 17 is reduced relative to the subband 16 in each case by an energy absolute value corresponding to the energy of an optical phonon of the semiconductor materials involved.

In order to pass on an electron from the valence band VB of the electron collector region K to the conduction band LB of the electron injector region I, two longitudinal optical phonon transitions are therefore made possible, such that the electron moving along the transport direction T has emitted an energy having an absolute value approximately of 30 meV twice by phonon excitation. The resulting energy gap between the subband 17 and the subband 15 is therefore significantly above the thermal energy at room temperature of approximately 26 meV. A movement of electrons counter to the transport direction T is thus discriminated. The undesirable loss path by backfilling counter to the transport direction T is effectively suppressed.

From left to right starting with the barrier layer 3, the interband cascade laser amplifier medium M illustrated according to FIG. 2 comprises a layer sequence comprising 2.5 nm AlSb/1.6 nm InAs/2.3 nm $Ga_{0.46}In_{0.54}As_{0.10}Sb_{0.50}$/ 1.30 nm InAs/1.2 nm AlSb/2.8 nm InAs/0.8 nm AlSb/6.5 nm GaSb/2.0 nm AlSb/5.05 nm InAs/1.2 nm AlSb.

Furthermore, in the construction chosen, the energetic position of the upper laser level or of the subband 11 in the amplifier region V is reduced relative to the miniband level MD by an energetic absolute value substantially equal to the energy of an optical phonon of 30 meV. This results in a rapid filling of the upper laser level and, here as well, in the pre-definition of a preferred direction for the movement of the charge carriers in the transport direction T.

Figure 3:
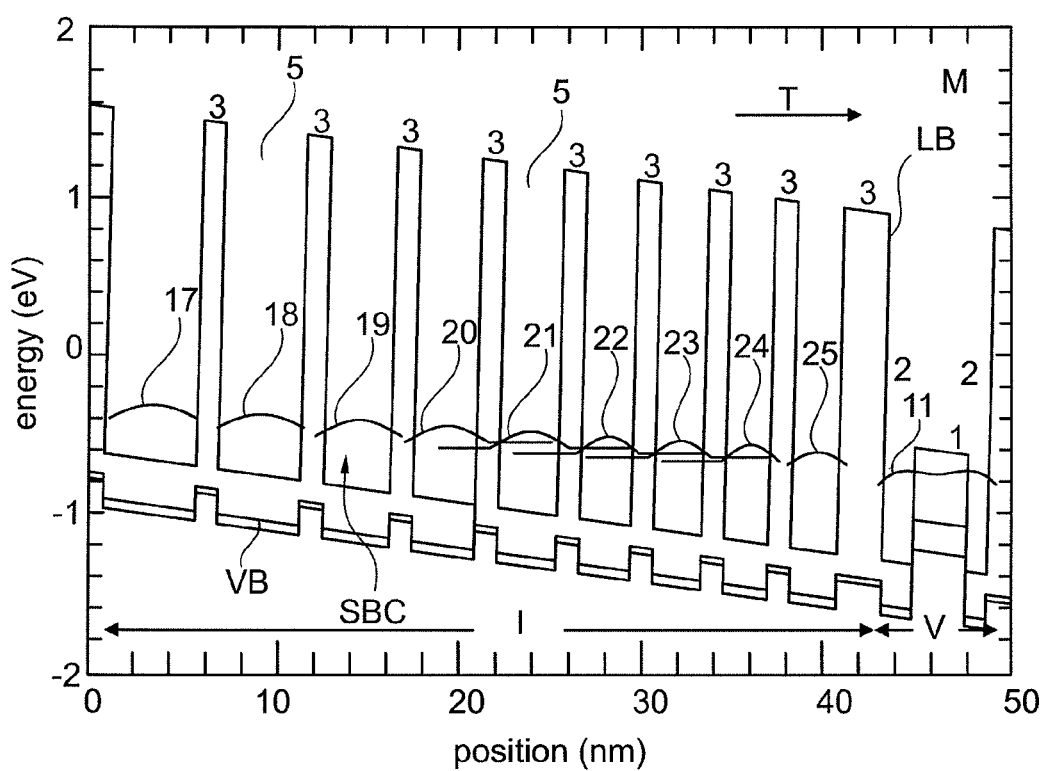
FIG. 3 shows a band diagram of an interband cascade laser amplifier medium with a subband cascade for a plurality of phonon-assisted transitions within the electron injector region.

FIG. 3 illustrates the band scheme of the electron injector region I and of the amplifier region V for a further interband cascade laser amplifier medium M. In this case, the amplifier region V is embodied analogously to the amplifier region V in accordance with FIG. 2.

In this case, the electron injector region I is designed in such a way that a series of the subbands 17 to 25 arising as a result of quantization in the injector quantum films 5 are reduced energetically in each case by the absolute value of an optical phonon with respect to one another in the transport direction T, in each case taking account of the electric field that results during operation.

In particular, this becomes evident from the subbands 20 to 24, which overlap along the transport direction T but in each case differ from one another by precisely said energy absolute value of one optical phonon. The involved subbands, that is to say in particular 20 to 24, overall form a subband cascade within which an electron moving along the transport direction T multiply emits the energy of an optical phonon. The total energy level that an electron would have to overcome in order to be able to pass through the laser structure illustrated here counter to the transport direction T is therefore a multiple of the thermal energy at room temperature. Undesirable thermal backfilling of subbands counter to the transport direction T is thus virtually completely eliminated.

The electron injector region I in accordance with FIG. 3 is realized by an injector layer sequence of (2.0/6.2/1.3/5.05/ 1.2/4.3/1.2/3.8/1.2/3.4/1.2/3.1/1.2/2.85/1.2/2.65/1.2/2.45/ 2.5), wherein the values are specified in nm, starting on the left of FIG. 3, and barrier layers comprising AlSb and injector quantum films comprising InAs respectively alternate. The conditions depicted can then be realized at a field strength of 150 kV/cm.

The invention claimed is:

1. An interband cascade laser amplifier medium having a number of cascades strung together along a transport direction of charge carriers and each comprising an electron injector region, an amplifier region and an electron collector region, wherein:

the amplifier region, comprises a hole quantum film comprising a first semiconductor material and an electron quantum film comprising a second semiconductor material;

the electron collector region comprises at least one collector quantum film comprising a third semiconductor material and separated by a first barrier layer;

the electron injector region comprises at least one injector quantum film comprising a fourth semiconductor material and separated by a second barrier layer;

the optical laser transition takes place between (i) a conduction band of the electron quantum film and (ii) a valence band of the hole quantum film of the amplifier region:

along the cascade and/or between two adjacent cascades in a conduction band and/or in a valence band, at least two subbands transport-coupled for charge carriers are formed in such a way that the succeeding subband in the transport direction, relative to the preceding subband in the transport direction, in the electric field of the operating case, is reduced energetically by an absolute value substantially equal to the energy of an optical phonon of the semiconductor materials involved; and wherein at least one of:

(A) the preceding subband in the transport direction of the two subbands that differ energetically by an absolute value substantially equal to the energy of an optical phonon is formed in the valence band of the electron collector region and the succeeding subband in the transport direction is formed in the conduction band of the electron injector region:

(B) the preceding subband in the transport direction of the two subbands that differ energetically by an absolute value substantially equal to the energy of an optical phonon is formed in the conduction band of the electron injector region and the succeeding subband in the transport direction is formed in the conduction band of the electron quantum film: and (C) the at least two subbands that differ energetically by an absolute value substantially equal to the energy of an optical phonon are formed in the conduction band of the electron injector region.

2. The interband cascade laser amplifier medium as claimed in claim 1, wherein the preceding subband in the transport direction of the two subbands that differ energetically by an absolute value substantially equal to the energy of an optical phonon is formed in the valence of the electron collector region and the succeeding subband in the transport direction is formed in the conduction band of the electron injector region.

3. The interband cascade laser amplifier medium as claimed in claim 1, wherein the preceding subband in the transport direction of the two subbands that differ energetically by an absolute value substantially equal to the energy of an optical phonon is formed in the conduction band of the electron injector region and the succeeding subband in the transport direction is formed in the conduction band of the electron quantum film.

4. The interband cascade laser amplifier medium as claimed in claim 1, wherein the preceding subband in the transport direction of the two subbands that differ energetically by an absolute value substantially equal to the energy of an optical phonon is formed in the valence band of the hole quantum film and the succeeding subband in the transport direction is formed in the valence band of the electron collector region.

5. The interband cascade laser amplifier medium as claimed in claim 1, wherein the at least two subbands that differ energetically by an absolute value substantially equal to the energy of an optical phonon are formed in the conduction band of the electron injector region.

6. The interband cascade laser amplifier medium as claimed in claim 1, wherein the electron injector region comprises a multiplicity of injector quantum films separated by second barrier layers, and wherein in the conduction band of the electron injector region along the transport direction a subband cascade is formed from subbands that differ energetically in each case by an absolute value substantially equal to the energy of an optical phonon.

7. The interband cascade laser amplifier medium as claimed in claim 1, wherein the at least two subbands that differ energetically by an absolute value substantially equal to the energy of an optical phonon are formed in the valence band of the electron collector region.

8. The interband cascade laser amplifier medium as claimed in claim 1, wherein the electron collector region comprises a multiplicity of collector quantum films separated by second barrier layers, and wherein in the valence band of the electron collector region along the transport direction a subband cascade is formed from subbands that differ energetically in each case by an absolute value substantially equal to the energy of an optical phonon.

9. The interband cascade laser amplifier medium as claimed in claim 1, wherein at least two electron quantum films are provided in the amplifier region.

10. The interband cascade laser amplifier medium as claimed in claim 1, wherein the first semiconductor material of the hole quantum film is a compound semiconductor selected from the group containing GaSb, GaInSb, GaSbAs, GaAlSb, AlGaInSb and AlGaAsSb.

11. The interband cascade laser amplifier medium as claimed in claim 1, wherein the first semiconductor material of the hole quantum film is a quaternary GaInSbAs compound semiconductor comprising, if appropriate, admixtures of Al, P and/or N.

12. The interband cascade laser amplifier medium as claimed in claim 11, wherein the first semiconductor material of the hole quantum film is a quaternary $Ga_xIn_{1-x}Sb_yAs_{1-y}$ compound semiconductor.

13. The interband cascade laser amplifier medium as claimed in claim 12, wherein x has a value of greater than 0 and less than or equal to 0.7.

14. The interband cascade laser amplifier medium as claimed in claim 12, wherein y has a value of between 0.5 and 0.99.

15. The interband cascade laser amplifier medium as claimed in claim 1, wherein the second semiconductor material of the electron quantum film is a compound semiconductor selected from the group containing InAs, InAsSb, InGaAs, InAlAs and GaInAsSb.

16. The interband cascade laser amplifier medium as claimed in claim 1, wherein the third semiconductor material of the collector quantum film is a compound semiconductor selected from the group containing GaSb, GaInSb, GaSbAs, GaInAsSb, AlGaInSb, AlGaAsSb and AlGaInAsSb.

17. The interband cascade laser amplifier medium as claimed in claim 1, wherein the fourth semiconductor material of the injector quantum film is a compound semiconductor selected from the group containing InAs, InAsSb, InGaAs, InAlAs, AlInAsSb and GaInAsSb.

18. The interband cascade laser amplifier medium as claimed in claim 1, wherein as material for the first and the second barrier layer a compound semiconductor is selected from the group containing AlSb, AlInSb, AlSbAs, AlGaSb and AlInAsSb.

19. An interband cascade laser comprising an interband cascade laser amplifier medium as claimed in claim 1.

* * * * *